US010400973B1

(12) United States Patent
Espinosa et al.

(10) Patent No.: US 10,400,973 B1
(45) Date of Patent: Sep. 3, 2019

(54) METHOD AND APPARATUS FOR COLOR ASSURANCE

(71) Applicant: Valeo North America, Inc., Troy, MI (US)

(72) Inventors: Mildred Espinosa, Seymour, IN (US); Patrick Martin, Seymour, IN (US)

(73) Assignee: Valeo North America, Inc., Troy, MI (US)

( * ) Notice: Subject to any disclaimer, the term of this patent is extended or adjusted under 35 U.S.C. 154(b) by 0 days.

(21) Appl. No.: 16/039,663

(22) Filed: Jul. 19, 2018

(51) Int. Cl.
| *H05B 33/08* | (2006.01) |
| *F21S 41/176* | (2018.01) |
| *H01S 5/0687* | (2006.01) |
| *H01S 5/042* | (2006.01) |
| *F21S 41/16* | (2018.01) |
| *F21S 41/141* | (2018.01) |
| *F21S 43/14* | (2018.01) |
| *F21S 43/16* | (2018.01) |
| *H01S 5/40* | (2006.01) |
| *F21Y 115/30* | (2016.01) |
| *F21Y 115/10* | (2016.01) |

(52) U.S. Cl.
CPC .......... *F21S 41/176* (2018.01); *F21S 41/141* (2018.01); *F21S 41/16* (2018.01); *F21S 43/14* (2018.01); *F21S 43/16* (2018.01); *H01S 5/042* (2013.01); *H01S 5/0687* (2013.01); *H01S 5/4025* (2013.01); *H05B 33/086* (2013.01); *H05B 33/0809* (2013.01); *H05B 33/0869* (2013.01); *F21Y 2115/10* (2016.08); *F21Y 2115/30* (2016.08)

(58) Field of Classification Search
CPC ................ B60Q 1/2607; B60Q 1/2696; H05B 33/0845; H05B 33/0851; H05B 33/0857

USPC ...................................................... 315/77, 82
See application file for complete search history.

(56) References Cited

U.S. PATENT DOCUMENTS

| 4,995,697 | A |   | 2/1991 | Adamovsky | |
| 9,572,223 | B1 | * | 2/2017 | Mula ................... | H05B 33/0869 |
| 2007/0045524 | A1 | * | 3/2007 | Rains, Jr. .................. | F21S 2/00 |
| | | | | | 250/228 |
| 2008/0055896 | A1 | * | 3/2008 | Feldmeier .......... | H05B 33/0872 |
| | | | | | 362/231 |
| 2009/0153075 | A1 | * | 6/2009 | Li ...................... | H05B 33/0818 |
| | | | | | 315/294 |

(Continued)

FOREIGN PATENT DOCUMENTS

| DE | 3034901 | 4/1981 |
| DE | 10353293 | 6/2005 |
| EP | 2728387 | 5/2014 |

*Primary Examiner* — Tung X Le
(74) *Attorney, Agent, or Firm* — Oblon, McClelland, Maier & Neustadt, L.L.P.

(57) ABSTRACT

Aspects of the disclosure provide a lighting apparatus for a vehicle and a method for color assurance of the lighting apparatus. The lighting apparatus includes a first lighting system and a lighting system controller. The first lighting system includes a first lighting device configured to emit first light in response to a first driving power, and a first color sensing device configured to generate a first color feedback signal that is indicative of a first color of the first light that is emitted by the first lighting device. The lighting system controller is configured to generate the first driving power to drive the first lighting device based on the first color feedback signal to ensure the first color satisfying a color requirement.

11 Claims, 5 Drawing Sheets

(56) References Cited

U.S. PATENT DOCUMENTS

| | | | |
|---|---|---|---|
| 2012/0086335 A1* | 4/2012 | Nguyen | B60Q 1/2607 |
| | | | 315/77 |
| 2012/0299476 A1* | 11/2012 | Roberts | B60Q 1/0011 |
| | | | 315/77 |
| 2016/0325109 A1 | 11/2016 | Knaus et al. | |
| 2017/0265260 A1* | 9/2017 | Briggs | H05B 33/0851 |

* cited by examiner

METHOD AND APPARATUS FOR COLOR ASSURANCE

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, a vehicle includes various lighting devices for illumination and signaling. The lighting devices are mounted or integrated at various positions, such as front, rear, sides, top, bottom and the like of the vehicle. The lighting devices can light the roadway for the driver, increase the visibility of the vehicle, and can be used to signal driver's intention to other drivers and pedestrians.

SUMMARY

Aspects of the disclosure provide a lighting apparatus for vehicle usage and a method for color assurance of the lighting apparatus. The lighting apparatus includes a first lighting system and a lighting system controller. The first lighting system includes a first lighting device configured to emit first light in response to a first driving power, and a first color sensing device configured to generate a first color feedback signal that is indicative of a first color of the first light that is emitted by the first lighting device. The lighting system controller is configured to generate the first driving power to drive the first lighting device based on the first color feedback signal to ensure the first color satisfying a color requirement.

In some embodiments, the lighting system controller is configured to drive the first lighting device based on the first color feedback signal to match the first color of the first light to a reference color.

Further, in an embodiment, the lighting apparatus includes a second lighting system. The second lighting system includes a second lighting device configured to emit second light in response to a second driving power, and a second color sensing device configured to generate a second color feedback signal that is indicative of a second color of the second light that is emitted by the second lighting device. The first lighting device and the second lighting device can be same device or different devices. The lighting system controller is configured to generate the first driving power and the second driving power based on the first feedback signal and the second feedback signal to match the first color with the second color.

In some embodiments, the first lighting system further includes a first thermal sensing device configured to generate a first thermal feedback signal that is indicative of a first temperature of the first lighting device. The lighting system controller is configured to generate the first driving power to drive the first lighting device based on the first color feedback signal and the first thermal feedback signal to ensure the first color satisfying the color requirement.

According to an aspect of the disclosure, the lighting system controller includes power regulation circuitry and control circuitry. The power regulation circuitry is configured to generate the first driving power based on a pulse width modulation (PWM) signal. The control circuitry is configured to adjust the PWM signal according to the first color feedback signal and a characteristic of the first lighting device.

In an embodiment, the first lighting device is a laser lighting device. The laser lighting device includes a laser diode array configured to emit an initial light of a first wavelength, and a phosphor conversion component configured to convert the initial light to the first light having multiple wavelengths. The first lighting system includes a plurality of color sensing devices are configured to generate color feedback signals that are indicative of colors of the initial light and the first light.

In some embodiment, the lighting apparatus is mounted on a vehicle, and operates in response to a vehicle control signal.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

According to aspects of the disclosure, a lighting system, such as a laser lighting system, a light emitting diode (LED) lighting system can use a color sensing device to provide a feedback signal to a controller. The controller can drive the lighting system based on the feedback signal and the other suitable signals to enable color assurance in the lighting system.

Figure 1:
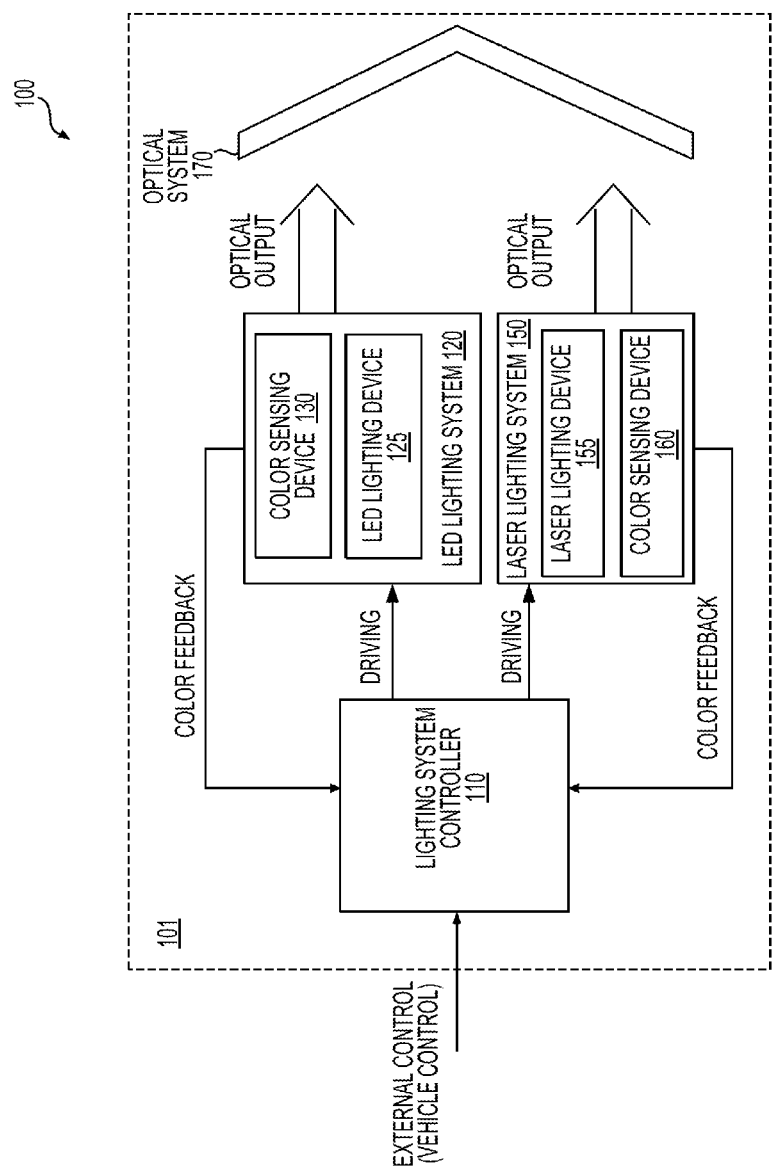
FIG. 1 shows a block diagram of a lighting apparatus 101 according to an embodiment of the disclosure.

FIG. 1 shows a block diagram of a lighting apparatus 101 according to an embodiment of the disclosure. The lighting apparatus 101 includes one or more lighting systems, such as an LED lighting system 120, a laser lighting system 150, and the like. The lighting apparatus 101 includes a lighting system controller 110 configured to drive the one or more lighting systems. Further, the lighting apparatus 101 includes an optical system 170 configured to direct and shape light output (also referred to as optical output) from the lighting apparatus 101.

The lighting apparatus 101 can be any suitable lighting apparatus, such as a lighting apparatus in a vehicle, a lighting apparatus for residential usage, and the like. In the FIG. 1 example, the lighting apparatus 101 is used in a vehicle 100. In an example, the lighting apparatus 101 is mounted at a front position of the vehicle 100 for front lighting. The lighting apparatus 101 receives external control signals, such as vehicle control signals from a vehicle center controller (not shown) of the vehicle 100, and operates in response to the external control signals. For example, when the vehicle center controller provides the external control signals for high beam, the lighting apparatus 101 emits high beam light that meets suitable vehicle lighting regulations, such as the world forum for harmonization of vehicle regulations, and the like accordingly. When the vehicle center controller provides the external control signals for low beam, the lighting apparatus 101 emits low beam light that meets the suitable vehicle lighting regulations accordingly. When the vehicle center controller provides the external control signals for day run lighting, the lighting apparatus 101 provides day run lighting that meets the suitable vehicle lighting regulations accordingly.

In some embodiments, the vehicle 100 is an autonomous vehicle 100. The lighting apparatus 101 is used in the autonomous vehicle 100. In an example, the lighting apparatus 101 is controlled by the vehicle center controller to provide suitable light to external objects or persons, such as a nearby vehicle, a nearby pedestrian and the like. For example, when the autonomous vehicle 100 detects a nearby pedestrian, the vehicle center controller controls the autonomous vehicle 100 to stop. When the autonomous vehicle 100 is fully stopped, the vehicle center controller provides the external control signals to the lighting apparatus 101 to emit, for example green light to signal the nearby pedestrian, for example to cross a street.

In some other embodiments, the lighting apparatus 101 is used for aesthetic-over-function purpose. In an example, the lighting apparatus 101 is configured to emit light of specific shapes and specific colors that are signatures of, for example, a car manufacture of the vehicle 100.

According to an aspect of the disclosure, a lighting system includes a lighting device and a color sensing device that are optically coupled, thus the color sensing device can detect the color or one or more wavelengths of the light that is emitted from the lighting device. For example, the LED lighting system 120 includes an LED lighting device 125 and a color sensing device 130 that are optically coupled, and the laser lighting system 150 includes a laser lighting device 155 and a color sensing device 160 that are optically coupled. In an example, when the LED lighting device 125 emits light, the color sensing device 130 generates an electrical signal with a property that varies with a wavelength of the light that is emitted by the LED lighting device 125. Thus, the electrical signal can be used to indicate the wavelength of the light, and is used as a color feedback signal to inform the wavelength of the LED lighting device 125 to the lighting system controller 110. Similarly, when the laser lighting device 155 emits light, the color sensing device 160 generates an electrical signal that is used to indicate a wavelength of the light that is emitted by the laser lighting device 155. The electrical signal can be used as a color feedback signal to inform the wavelength of the emitted light by the laser lighting device 155 to the lighting system controller 110.

While in the FIG. 1 example, one pair of the LED lighting device 125 and the color sensing device 130 is used in the LED lighting system 120 as an example, the LED lighting system 120 can include multiple pairs of LED lighting devices and color sensing devices. The color sensing devices are optically coupled with the LED lighting devices to respectively generate electrical signals that can be used to indicate the wavelengths of the light respectively emitted from the LED lighting devices.

While in the FIG. 1 example, one pair of the laser lighting device 155 and the color sensing device 160 is used in the laser lighting system 150 as an example, the laser lighting system 150 can include multiple pairs of laser lighting devices and color sensing devices. The color sensing devices are optically coupled with the laser lighting devices to respectively generate electrical signals that can be used to indicate the wavelengths of the light respectively emitted from the laser lighting devices.

It is noted that the color sensing device 130 and the color sensing device 160 can be implemented by various techniques. In an example, a color sensing device includes photodiodes implemented in silicon. For example, two p-n junctions are aligned vertically in the silicon crystal. When light enters the color sensing device, the color sensing device outputs two photocurrents respectively corresponding to the two p-n junctions. The ratio of the two photocurrents is indicative of the wavelength of the light that enters the color sensing device. For example, the ratio of the two photocurrents is proportional to the wavelength of the light that enters the color sensing device.

In another example, a color sensing device can be implemented using phototransistors and microelectromechanical systems (MEMS). For example, a silicon chip is implemented with multiple structures that are configured to respond differently with respect to different wavelength ranges. Based on the output responses of the multiple structures, the wavelength of an incident light can be derived.

In another example, a color sensing device includes multiple photodiodes that are sensitive to different wavelength ranges. Based on the outputs of the photodiodes, wavelength components in the incident light can be derived.

In some embodiments, the LED lighting device 125 includes a plurality of light emitting diodes. In an example, a light emitting diode is formed of a p-n junction on semiconductor substrate. The light emitting diode has two leads, and when a suitable current is applied to the leads, electrons are able to recombine with holes, the recombination releases energy in the form of photons. Generally, the color (wavelength) of the emitted light (corresponding to the energy of the photon) is determined by the energy bandgap of the semiconductor. The energy bandgap of semiconductor tends to change with temperature. For example, the energy bandgap of semiconductor can decrease when the temperature increases.

In some embodiments, the plurality of light emitting diodes are configured to emit light of different colors, and the light emitted by the plurality of light emitting diodes is combined to form the output light of the LED lighting device 125.

During operation, in an example, when the lighting system controller 110 provides a driving current to the LED lighting device 125, the driving current flows through the LED lighting device 125 and the LED lighting device 125 emits light of a color. In an example, due to the driving current, the LED lighting device 125 generates heat, the temperature of the semiconductor substrate can rise, and the color of the emitted light by the LED lighting device 125 can vary. It is noted that the temperature of the semiconductor substrate can be affected by other factors, such as environmental temperature and the like.

In the FIG. 1 example, the color sensing device 130 can generate the electrical signals that are indicative of the color change of the emitted light by the LED lighting device 125. Then, the lighting system controller 110 can adjust the driving current to counteract temperature change in order to stable the color of the emitted light by the LED lighting device 125.

In some embodiments, the laser lighting device 155 includes a laser diode that is a semiconductor device similar to light emitting diode. In an example, a laser diode is formed of a p-n junction on semiconductor substrate. The laser diode has two leads, and when a suitable current is applied to the leads, electrons are able to recombine with holes, the recombination releases energy in the form of photons. Generally, the color (wavelength) of the laser lighting device 155 is determined by the energy bandgap of the semiconductor. The energy bandgap of semiconductor tends to change with temperature. For example, the energy bandgap of semiconductor can decrease when the temperature increases.

During operation, in an example, when the lighting system controller 110 provides a driving current to the laser lighting device 155, the laser lighting device 155 emits light of a color. In an example, laser lighting device 155 generates heat, the temperature of the semiconductor substrate can rise, and the color of the emitted light by the laser lighting device 155 can vary. It is noted that the temperature of the semiconductor substrate can be affected by other factors, such as environmental temperature and the like.

In the FIG. 1 example, the color sensing device 160 can generate the electrical signals that are indicative of the color change of the emitted light by the laser lighting device 155. Then, the lighting system controller 110 can adjust the driving current to counteract temperature change in order to stable the color of the emitted light by the laser lighting device 155.

In some embodiments, the lighting system controller 110 is configured to adjust a driving current to a lighting system to stable the emitted light with regard to a reference light (not shown) that is relatively stable with temperature changes. In some embodiments, the lighting apparatus 101 includes multiple lighting systems, such as the LED lighting system 120, the laser lighting system 150, and the like, that can operate at the same time to emit light. In the FIG. 1 example, the lighting system controller 110 receives a first color feedback signal from the LED lighting system 120 and a second color feedback signal from the laser lighting system 150. The lighting system controller 110 adjusts the driving current to the LED lighting system 120 and the laser lighting system 150 to ensure characteristics of the combined light outputs from the two lighting systems. In an example, the lighting system controller 110 adjusts the driving current to the LED lighting system 120 and the laser lighting system 150 to ensure the light emitted by the LED lighting device 125 and the light emitted by the laser lighting device 155 are of the same color in an example.

It is noted that, in some embodiments, the lighting system controller 110 also receives temperature feedback signals (not shown) that are indicative of p-n junction temperatures. The lighting system controller 110 is configured to adjust the driving current based on a combination of the temperature feedback signals and the color feedback signals. For example, the lighting system controller 110 can suitable weight the temperature feedback signals and the color feedback signals, and adjust the driving current accordingly.

Figure 2:
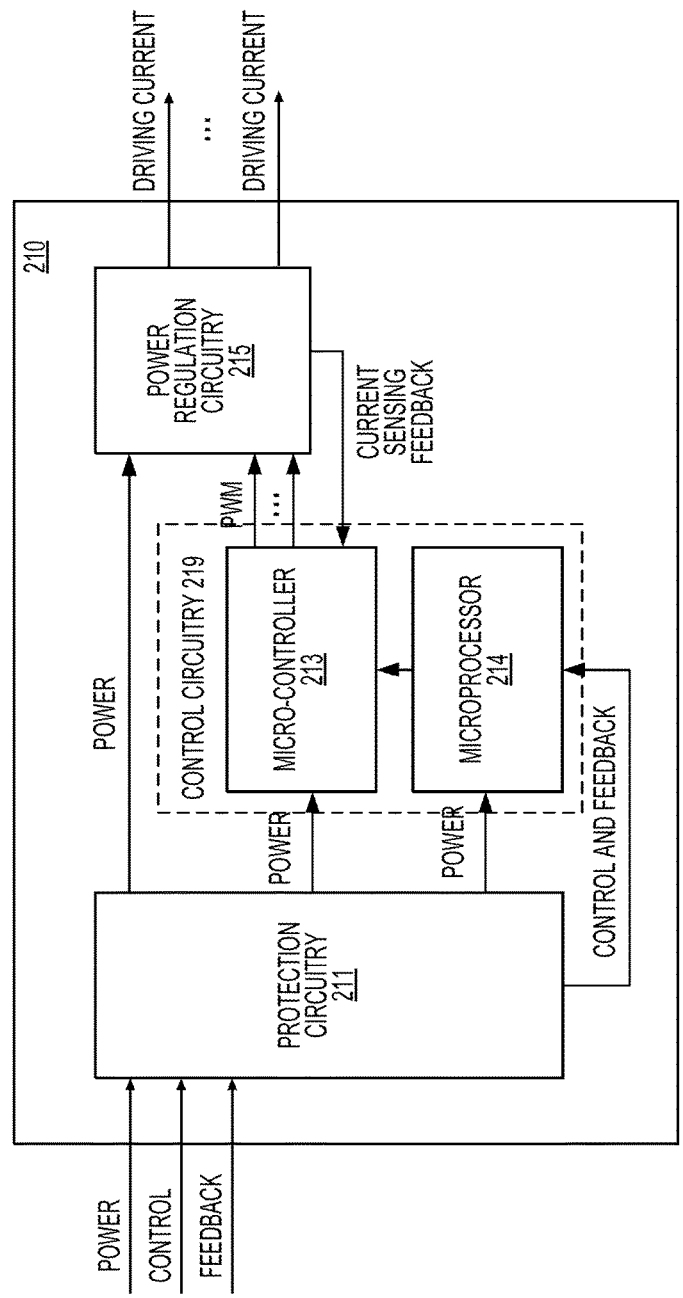
FIG. 2 shows a block diagram of a lighting system controller according to an embodiment of the disclosure.

FIG. 2 shows a block diagram of a lighting system controller 210 according to an embodiment of the disclosure. In an example, the lighting system controller 210 is used in the lighting apparatus 101 in the place of the lighting system controller 110.

In some embodiments, the lighting system controller 210 is implemented on a silicon chip. In some embodiments, the lighting system controller 210 is implemented in a package that includes multiple silicon chips in the package. In some embodiments, the lighting system controller 210 is implemented on a printed circuit board (PCB) with multiple chip packages.

The lighting system controller 210 receives power, control signals and feedback signals, and outputs driving current for one or multiple loads based on the control signals and the feedback signals. In the FIG. 2 example, the lighting system controller 210 includes protection circuitry 211, control circuitry 219 and power regulation circuitry 215 coupled together as shown in FIG. 2. The control circuitry 219 can be implemented using various techniques. In the FIG. 2 example, the control circuitry 219 includes a micro-controller 213 and a microprocessor 214.

In some embodiments, the power is provided from a battery, such as a vehicle battery in the form of 12V DC voltage for example. The control signals are vehicle control signals from a vehicle controller. The feedback signals are indicative of the status of the loads, such as a temperature of a p-n junction at a load, a color of light emitted from a lighting device of a load, and the like.

The protection circuitry 211 is configured to provide various protections to the incoming signals and power lines and provide protections to internal circuitry as well. In an example, the protection circuitry 211 is configured to address electromagnetic compatibility (EMC), and provide protection to electrostatic discharge (ESD), and the like.

In the FIG. 2 example, the power is suitably provided to the micro-controller 213 and the microprocessor 214 to enable their operations. Further, the power is input to the power regulation circuitry 215, and the power regulation circuitry 215 provides suitable driving current to drive the loads based on the provided power.

In some embodiments, the power regulation circuitry 215 is a switching based power regulator configured to perform power conversion from an input power (such as a 12V supply voltage from a battery) to multiple output driving powers that are respectively suitable for the multiple loads. The power regulation circuitry 215 can be implemented using any suitable topology, such as a fly-back topology, a buck-boost topology and the like. In some embodiments, the power regulation circuitry 215 includes multiple stages in series to regulate the power to satisfy certain requirements. The multiple stages can use different topologies.

In some examples, a power regulation stage in the power regulation circuitry 215 includes a switch, energy storage components (e.g., an inductor, a capacitor, and the like), a filter to generate a power output. In an example, the switch is controlled by high frequency signal, such as a PWM signal, to switch on and switch off. In an example, when the switch is switched on, an energy storage component (e.g., an inductor) is charged to store energy. When the switch is switched off, the energy storage component discharges to its load and another energy storage component (e.g., a capacitor). When the switch is switched on/off fast, the energy storage component is charged and discharged slightly in each cycle, and a relatively steady voltage to the load can be maintained.

In the FIG. 2 example, the micro-controller 213 is configured to output PWM signals to the power regulation circuitry 215. In some embodiments, the micro-controller 213 receives a current sensing feedback signal that is indicative of a driving current to a load, and adjusts the PWM signal that is used to generate the driving current based on the current sensing feedback signal to maintain the driving current to be relatively constant.

The microprocessor 214 receives the control signals that are provided from a vehicle controller that is external to the lighting system controller 110. Further, the microprocessor 214 receives the feedback signals, such as the color feedback signals, the temperature feedback signals, and the like, and provides PWM control signals to the micro-controller 213 to adjust the PWM signals. In an example, the micro-controller 213 is configured to adjust a width of pulses in a PWM signal in response to a PWM control signal from the microprocessor 214. In another example, the micro-controller 213 is configured to adjust a peak value of pulses in a PWM signal in response to a PWM control signal from the microprocessor 214. In another example, the micro-controller 213 is configured to adjust a duty cycle of a PWM signal in response to a PWM control signal from the microprocessor 214.

In some embodiments, the microprocessor 214 executes software instructions corresponding to an algorithm to generate the PWM control signals based on the control signals and the feedback signals. In addition, in some embodiments, lighting device characteristics (e.g., LED characteristics, laser device characteristics) can be input and stored in a memory (not shown) that can be accessed by the microprocessor 214.

In an example, the lighting device is characterized by a supplier, and the characteristics are stored in the form of a datasheet. The datasheet is input and stored in the memory. The microprocessor 214 can access the memory to retrieve the datasheet and then generate the PWM control signals based on the datasheet.

Figure 3:
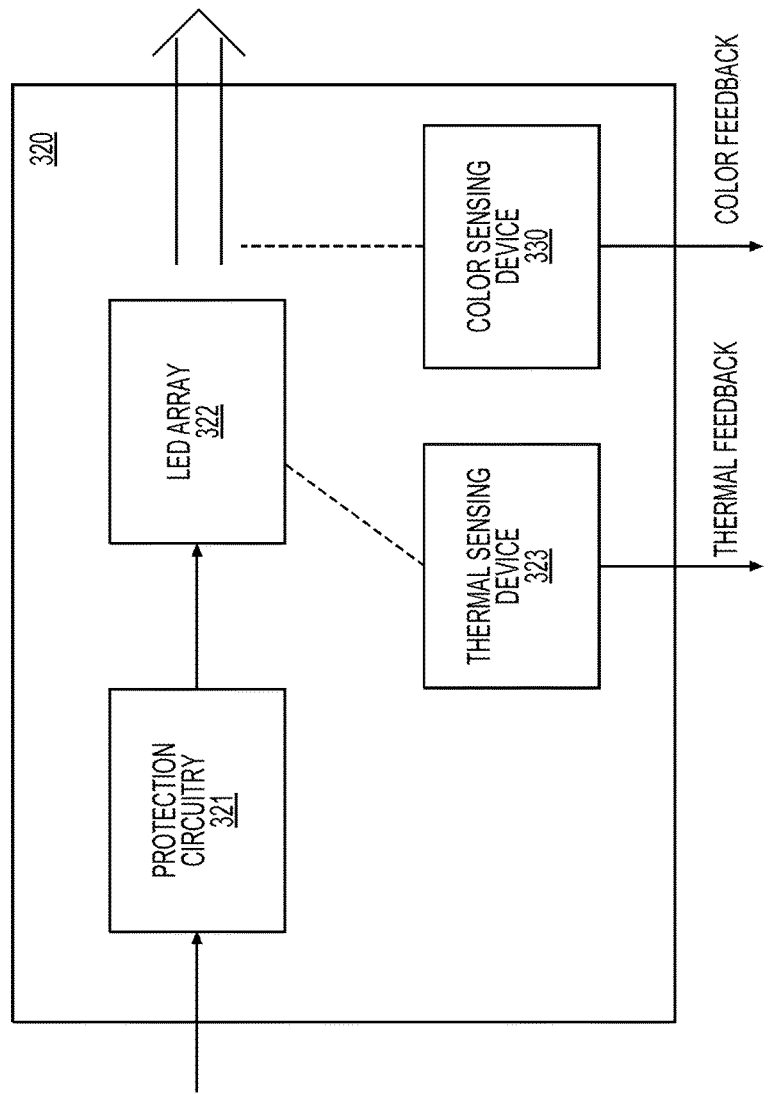
FIG. 3 shows a block diagram of a light emitting diode (LED) lighting system according to an embodiment of the disclosure.

FIG. 3 shows a block diagram of a light emitting diode (LED) lighting system 320 according to an embodiment of the disclosure. The LED lighting system 320 can be used in the lighting apparatus 101 in the place of the LED lighting system 120 in an example.

In some embodiments, the LED lighting system 320 is implemented on a printed circuit board (PCB) with multiple chip packages.

The LED lighting system 320 includes protection circuitry 321, an LED array 322, a thermal sensing device 323 and a color sensing device 330 coupled together as shown in FIG. 3.

The LED lighting system 320 receives driving power in the form of a driving current in an example. The protection circuitry 321 is configured to provide various protections to the power line and protections to internal circuitry as well. In an example, the protection circuitry 321 is configured to address electromagnetic compatibility (EMC), provide protection to electrostatic discharge (ESD), and the like. The protected driving power is provided to the LED array 322 to drive the LED array 322.

The LED array 322 includes a plurality of light emitting diodes that are coupled together in serial and/or in parallel. The thermal sensing device 323 is configured to be thermally coupled to the LED array 322. For example, the thermal sensing device 323 is disposed to be in touch with the substrate of a LED in the LED array 322. The color sensing device 330 is configured to be optically coupled with the LED array 322. For example, the color sensing device 330 is disposed to receive a small portion of the light emitted by the LED array 322. During operation, the thermal sensing device 323 generates a thermal feedback signal that is indicative of a temperature of the p-n junction formed in the substrate; and the color sensing device 330 generates a color feedback signal that is indicative of the color of the emitted light from the LED array 322. The thermal feedback signal and the color feedback signal can be fed back to, for example, the lighting system controller 110, the lighting system controller 210, and the like to adjust the driving current to the LED lighting system 320.

Figure 4:
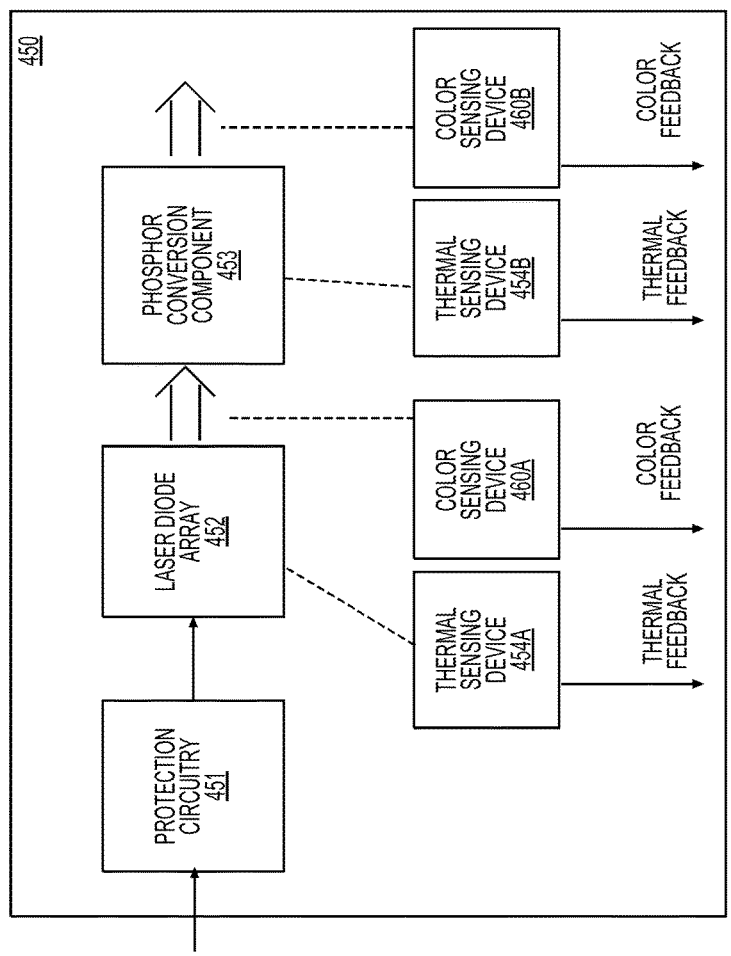
FIG. 4 shows a block diagram of a laser lighting system according to an embodiment of the disclosure.

FIG. 4 shows a block diagram of a laser lighting system 450 according to an embodiment of the disclosure. The laser lighting system 450 can be used in the lighting apparatus 101 in the place of the laser lighting system 150 in an example.

In some embodiments, the laser lighting system 450 is implemented on a printed circuit board (PCB) with multiple chip packages.

The laser lighting system 450 includes protection circuitry 451, a laser diode array 452, a phosphor conversion component 453, a first thermal sensing device 454A that is thermally coupled with the laser diode array 452, a first color sensing device 460A that is optically coupled with the laser diode array 452, a second thermal sensing device 454B that is thermally coupled with the phosphor conversion component 453, and a second color sensing device 460B that is optically coupled with the phosphor conversion component 453.

The laser lighting system 450 receives driving power in the form of a driving current in an example. The protection circuitry 452 is configured to provide various protections to the power line and protections to internal circuitry as well. In an example, the protection circuitry 452 is configured to address electromagnetic compatibility (EMC), provide protection to electrostatic discharge (ESD), and the like. The protected driving power is provided to the laser diode array 452 to drive the laser diode array 452.

The laser diode array 452 includes a plurality of laser diodes that are coupled together in serial and/or in parallel. The first thermal sensing device 454A is configured to be thermally coupled to the laser diode array 452. For example, the first thermal sensing device 454A is disposed to be in touch with the substrate of a laser diode in the laser diode array 452. The first color sensing device 460A is configured to be optically coupled with the laser diode array 452. For example, the first color sensing device 460A is disposed to receive a small portion of the light emitted by the laser diode array 452. During operation, the first thermal sensing device 454A generates a first thermal feedback signal that is indicative of a temperature of the p-n junction formed in the substrate; and the first color sensing device 460A generates a first color feedback signal that is indicative of the color of the emitted light from the laser diode array 452.

In an example, the laser diode array 452 is configured to emit blue color, and the phosphor conversion component 453 is configured to absorb a portion of the blue light that is emitted by the laser diode array 452 and emit in a broad range from greenish to reddish, with most of output in yellow. This yellow emission is combined with the remaining blue emission to give the "white" light that is the converted light from the phosphor conversion component 453.

In some embodiments, the color of the converted light from the phosphor conversion component 453 is affected by local temperature of the phosphor conversion component 453. In the FIG. 4 example, the second thermal sensing device 454B is configured to be thermally coupled to the phosphor conversion component 453. For example, the second thermal sensing device 454B is disposed to be in touch with the phosphor conversion component 453. The second color sensing device 460B is configured to be optically coupled with the phosphor conversion component 453. For example, the second color sensing device 460B is disposed to receive a small portion of the converted light by the phosphor conversion component 453. During operation, the second thermal sensing device 454B generates a second thermal feedback signal that is indicative of a temperature of the phosphor conversion component 453; and the second color sensing device 460B generates a second color feedback signal that is indicative of the color of the converted light by the phosphor conversion component 453.

The first thermal feedback signal, the second thermal feedback signal, the first color feedback signal and the second color feedback signal can be fed back to, for example, the lighting system controller 110, the lighting system controller 210, and the like to adjust the driving current to the laser lighting system 450.

Figure 5:
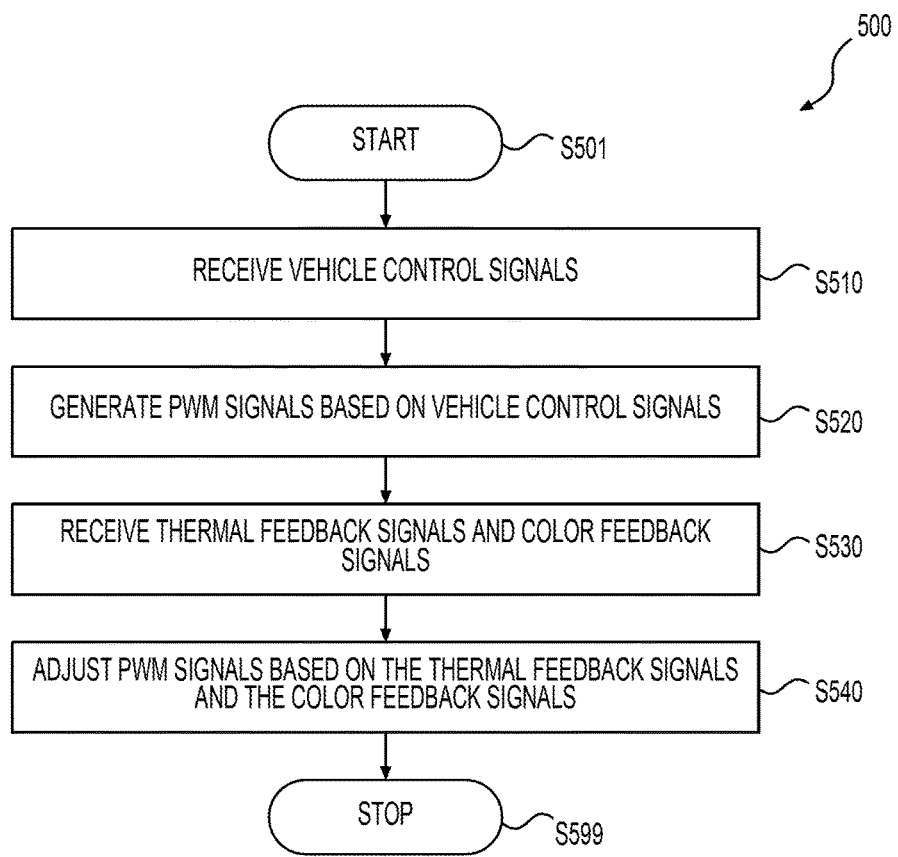
FIG. 5 shows a flow chart outlining a process example according to an embodiment of the disclosure.

FIG. 5 shows a flow chart outlining a process example 500 according to an embodiment of the disclosure. In an example, the process 500 is executed by the control circuitry 219. The process starts at S501 and proceeds to S510.

At S510, vehicle control signals are received. In an example, a supply voltage, such as 12V, is provided to the lighting system controller 210, and the control circuitry 219 is powered up. Further, the lighting system controller 210 receives vehicle control signals from a vehicle controller.

At S520, PWM signals are generated in response to the vehicle control signals. In an example, when the vehicle control signals are indicative of turning off the front light for example, microprocessor 214 controls the micro-controller 213 to disable the PWM signals, thus no driving current is provided to the lighting system. When the vehicle control signals are indicative of turning on the front light for example, the microprocessor 214 controls the micro-controller 213 to output the PWM signals. The PWM signals are provided to the power regulation circuitry 215 to generate driving current for driving loads, such as the LED lighting system 120, the laser lighting system 150, and the like.

At S530, thermal feedback signals and color feedback signals are received. In an example, when the driving current is provided to an LED lighting system, such as the LED lighting system 320, the LED array 322 emits light. The substrate temperature of the LED array 322 may change, the thermal sensing device 323 generates the thermal feedback signal that is indicative of the substrate temperature. Further, the color sensing device 330 generates the color feedback signal that is indicative of the color of the emitted light by the LED array 322. The thermal feedback signal and the color feedback signal are provided to the lighting system controller 210.

In another example, when the driving current is provided to a laser lighting system, such as the laser lighting system 450, the laser diode array 452 emits blue light, and the phosphor conversion component 453 converts the blue light to output "white light". The first thermal sensing device 454A generates the first thermal feedback signal that is indicative of the temperature of the p-n junction formed in the substrate of the laser diode array 452; and the first color sensing device 460A generates the first color feedback signal that is indicative of the color of the emitted light from the laser diode array 452. The second thermal sensing device 454B generates a second thermal feedback signal that is indicative of a temperature of the phosphor conversion component 453; and the second color sensing device 460B generates a second color feedback signal that is indicative of the color of the converted light by the phosphor conversion component 453. The first and second thermal feedback signals and the first and second color feedback signals are provided to the lighting system controller 210.

At S540, the PWM signals are adjusted based on the thermal feedback signals and the color feedback signals. In an example, the microprocessor 214 receives the color feedback signals and the temperature feedback signals, and provides PWM control signals to the micro-controller 213 to adjust the PWM signals. The micro-controller 213 is configured to adjust, for example, a width of pulses in a PWM signal, a peak value of pulses in a PWM signal, a duty cycle of a PWM signal, and the like in response to a PWM control signal from the microprocessor 214. Thus, the driving currents that are produced based on the PWM signals are adjusted accordingly. Then the process proceeds to S599 and terminates.

It is noted that, the process 500 can be dynamically executed. For example, from S540, the process can return to S530.

It is noted that, in an example, a lighting apparatus includes multiple lighting systems, and the process 500 can be executed in parallel to respectively control the multiple lighting systems for color assurance. The control circuitry 219 continuously receives the thermal feedback signals and the color feedback signals from the multiple lighting systems, and then respectively adjusts the PWM signals based on the thermal feedback signals and the color feedback signals.

When implemented in hardware, the hardware may comprise one or more of discrete components, an integrated circuit, an application-specific integrated circuit (ASIC), etc.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An apparatus, comprising:
  a first lighting system that comprises:
    a first lighting device including at least a light emitting diode (LED) array, the first lighting device configured to emit first light in response to a first driving power; and
    a first color sensing device configured to generate a first color feedback signal that is indicative of a first color of the first light that is emitted by the first lighting device;
  a second lighting system comprises:
    a second lighting device including at least a laser diode array, the second lighting device configured to emit second light in response to a second driving power; and
    a second color sensing device configured to generate a second color feedback signal that is indicative of a second color of the second light that is emitted by the second lighting device; and
  a lighting system controller configured to generate the first driving power and the second driving power based on the first color feedback signal and the second color feedback signal to match the first color with the second color.

2. The apparatus of claim 1, wherein the lighting system controller is configured to drive the first lighting device based on the first color feedback signal to match the first color of the first light to a reference color.

3. The apparatus of claim 1, wherein
  the first lighting system further comprises:
    a first thermal sensing device configured to generate a first thermal feedback signal that is indicative of a first temperature of the first lighting device; and
  the lighting system controller is configured to generate the first driving power to drive the first lighting device based on the first color feedback signal and the first thermal feedback signal to ensure the first color satisfying a color requirement.

4. The apparatus of claim 1, wherein the first color sensing device comprises at least one of a phototransistor and a photodiode.

5. The apparatus of claim 1, wherein the lighting system controller comprises:
power regulation circuitry configured to generate the first driving power based on a pulse width modulation (PWM) signal; and
control circuitry configured to adjust the PWM signal according to the first color feedback signal and a characteristic of the first lighting device.

6. The apparatus of claim 1, wherein
the second lighting device is a laser lighting device that comprises:
the laser diode array configured to emit an initial light of a wavelength; and
a phosphor conversion component configured to convert the initial light to the second light having multiple wavelengths;
a plurality of color sensing devices are configured to generate color feedback signals that are indicative of colors of the initial light and the second light.

7. A method comprising:
generating, by power regulation circuitry, a first driving power to drive a first lighting device to emit first light;
generating, by a first color sensing device, a first color feedback signal that is indicative of a first color of the first light that is emitted by the first lighting device including at least a light emitting diode (LED);
generating, by the power regulation circuitry, a second driving power to drive a second lighting device to emit second light;
generating, by a second color sensing device, a second color feedback signal that is indicative of a second color of the second light that is emitted by the second lighting device including at least a laser diode array; and
adjusting the first driving power and the second driving power based on the first color feedback signal and the second color feedback signal to match the first color with the second color.

8. The method of claim 7, further comprising:
generating, by a first thermal sensing device, a first thermal feedback signal that is indicative of a first temperature of the first lighting device; and
generating the first driving power to drive the first lighting device based on the first color feedback signal and the first thermal feedback signal to ensure the first color satisfying a color requirement.

9. The method of claim 7, further comprising:
generating the first driving power based on a pulse width modulation (PWM) signal; and
adjusting the PWM signal according to the first color feedback signal and a characteristic of the first lighting device.

10. The method of claim 7, further comprising:
driving the laser diode array to emit an initial light of a wavelength;
converting, by a phosphor conversion component, the initial light to the second light having multiple wavelengths; and
generating color feedback signals that are indicative of the wavelength of the initial light and multiple wavelengths of the second light.

11. A vehicle having a lighting apparatus, the lighting apparatus comprising:
a first lighting system that comprises:
a first lighting device including at least a light emitting diode (LED) array, the first lighting device configured to emit first light in response to a first driving power; and
a first color sensing device configured to generate a first color feedback signal that is indicative of a first color of the first light that is emitted by the first lighting device;
a second lighting system that comprises:
a second lighting device including at least a laser diode array, the second lighting device configured to emit second light in response to a second driving power; and
a second color sensing device configured to generate a second color feedback signal that is indicative of a second color of the second light that is emitted by the second lighting device; and
a lighting system controller configured to generate the first driving power and the second driving power based on the first color feedback signal and the second color feedback signal to match the first color with the second color, and receive a vehicle control signal from a vehicle controller, and generate the first driving power in response to the vehicle control signal,
wherein
the first lighting system further comprises:
a first thermal sensing device configured to generate a first thermal feedback signal that is indicative of a first temperature of the first lighting device; and
the lighting system controller is configured to generate the first driving power to drive the first lighting device based on the first color feedback signal and the first thermal feedback signal to ensure the first color satisfying a color requirement;
the lighting system controller comprises:
power regulation circuitry configured to generate the first driving power based on a pulse width modulation (PWM) signal; and
control circuitry configured to adjust the PWM signal according to the first color feedback signal and a characteristic of the first lighting device;
the second lighting device is a laser lighting device that comprises:
the laser diode array configured to emit an initial light of a wavelength;
a phosphor conversion component configured to convert the initial light to the second light having multiple wavelengths; and
a plurality of color sensing devices are configured to generate color feedback signals that are indicative of colors of the initial light and the second light.

* * * * *